United States Patent [19]
Gulczynski

[11] Patent Number: 5,099,241

[45] Date of Patent: Mar. 24, 1992

[54] DUAL FLASH ANALOG-TO-DIGITAL CONVERTER

[76] Inventor: Zdzislaw Gulczynski, P.O. Box 11633, Costa Mesa, Calif. 92627

[21] Appl. No.: 316,592

[22] Filed: Feb. 24, 1989

Related U.S. Application Data

[63] Continuation-in-part of Ser. No. 75,448, Jul. 20, 1987, Pat. No. 4,857,931.

[51] Int. Cl.$^5$ ............................................... H03M 1/36
[52] U.S. Cl. ..................................... 341/159; 341/158
[58] Field of Search ............... 341/159, 156, 118, 122, 341/126, 141, 120, 158, 160; 375/28

[56] References Cited

U.S. PATENT DOCUMENTS

| | | | |
|---|---|---|---|
| 4,763,106 | 8/1988 | Gulczynski | 341/156 |
| 4,857,931 | 8/1989 | Gulczynski | 341/156 |

Primary Examiner—A. D. Pellinen
Assistant Examiner—Brian Young

[57] ABSTRACT

This multi-flash analog-to-digital converter (ADC), in particular dual flash ADC, has extremely high speed and resolution. The final resolution of a comparator/multiplexer section can be effectively doubled. For instance, a 16-bit ADC can employ 300 rather than 255 comparators. A monolithic integration can be accomplished. A resistive network is coupled to a current source and to a reference signal for providing a plurality of comparison signals. A comparator/multiplexer section compares the comparison signals against ground, selects one of the comparison signals and produces a code. The ADC input signal and selected comparison signal are subsequently applied to an amplifier which provides the reference signal. Two codes are encoded and converted into the output code of the ADC.

7 Claims, 5 Drawing Sheets

DUAL FLASH ANALOG-TO-DIGITAL CONVERTER

CROSS REFERENCE TO RELATED APPLICATIONS

This application is file wrapper continuation of prior application Ser. No. 075,448 filed Jul. 20, 1987 now U.S. Pat. No. 4,857,931.

This application is also related to:
"High Resolution True Flash Analog-to-Digital Converter"
Ser. No. 304,505 filed Jan. 31, 1989 now abandoned;
"Encoder and Digital Memory for Flash Analog-to-Digital Converters"
Ser. No. 304,506 filed Jan. 31, 1989 now abandoned;
"Ultra Fast High Resolution Digital-to-Analog Converter"
Ser. No. 304,507 filed Jan. 31, 1989 now U.S. Pat. No. 4,958,155;
"High Accuracy Reference Ladder"
Ser. No. 304,510 filed Jan. 31, 1989 now U.S. Pat. No. 4,929,848;
"High Speed Integrating Analog-to-Digital Converter"
Ser. No. 251,171 filed Sept. 30, 1988 now U.S. Pat. No. 4,940,982;
"Flash Analog-to-Digital Converter with Integrating Input Stage"
Ser. No. 248,495 filed Sept. 22, 1988 now abandoned;
"Encoder for Fish Analog-to-Digital Converters"
Ser. No. 225,240 filed Jul. 28, 1988 now abandoned;
"Sample-and-Hold Amplifier with Current Source Charger"
Ser. No. 201,071 filed May 27, 1988 now U.S. Pat. No. 4,980,686;
"High Speed Integrating Digital-to-Analog Converter"
Ser. No. 198,110 filed May 23, 1988;
"High Speed Instrumentation Amplifier with Minimized Offset Voltage and Drift"
Ser. No. 180,434 filed Apr. 12, 1988 now U.S. Pat. No. 4,829,263;
"Digital-to-Analog Converter with Digital Correction"
Ser. No. 177,864 filed Mar. 23, 1988 now U.S. Pat. No. 4,843,392;
"Flash Analog-to-Digital Converter"
U.S. Pat. No. 4,763,106 dated Aug. 9, 1988;
"Digital-to-Analog Converter"
U.S. Pat. No. 4,811,017 dated Mar. 7, 1989;
"Digital-to-Analog Converter"
Ser. No. 075,450 filed Jul. 20, 1989 now U.S. Pat. No. 4,837,572; and
"Operational Amplifier or Comparator Circuit with Minimized Offset Voltage and Drift"
U.S. Pat. 4,749,953 dated Jun. 7, 1988.
All inventions are by the same inventor.

BACKGROUND OF THE INVENTION

The invention relates to a multi-flash analog-to-digital converter (ADC), in particular dual flash ADC, for digital systems requiring an extremely fast high resolution conversion of an analog input signal into a corresponding digital output code.

Two parts can be distinguished in every flash ADC: an analog and a digital section. The analog section of the conventional flash ADCs consists of a reference source, comparators connected in parallel and a chain of equally valued resistors providing reference voltages thereto. The digital section consists of an encoder for sampling comparator output signals, correcting faulty code sequences and obtaining the binary output code, and a register for storing the code. All ADCs are clocked.

The conventional flash ADCs offer the fastest possible conversion as the quantization level of the input voltage is determined immediately. They do suffer however from many problems, mostly originating from a very high circuit complexity. For instance, an ordinary 10-bit flash ADC demands 1023 comparators and comparable number of switching elements to a modern 16-bit microprocessor. A 16-bit ADC according to ordinary constructions is virtually impossible, requiring 65535 comparators not to mention other necessary components. An input track-and-hold amplifier (THA) is mandatory for optimizing speed and accuracy.

The conventional dual flash ADCs first "flash encode" most significant bits (MSBs) which are then converted in a digital-to-analog converter into an analog signal. This signal is subtracted from the input signal of the ADC, the result is amplified and available for a second conversion in a similar circuit to yield least significant bits (LSBs). The MSBs and LSBs are added for obtaining the output code of the ADC. A THA and a digital correction are necessary. The dual flash ADCs offer fastest possible conversion, whereby the resolution is almost twice as high as of the flash ADC chip used in the device. Another subranging ADC is a triple flash ADC in which a third conversion is employed for obtaining even higher resolution. The high circuit complexity, variety of technologies, necessity of trimming numerous individual components, etc. makes a monolithic integration of these ADCs troublesome. Not the least of the significant drawbacks is high cost.

SUMMARY OF THE INVENTION

The invention is intended to provide a dual flash ADC having an extremely high speed and resolution. The number of components is drastically reduced so that a monolithic and even hybrid integration of the present embodiments can be accomplished.

According to the present invention an ADC converts input signal into output code and comprises: a pair of reference signal sources, a resistive means coupled between the reference signal sources for providing a plurality of reference signals, comparator means for comparing a first and second comparison signals against the reference signals, and producing respectively a first and second codes in response thereto, a multiplexer means for selecting one of the reference signals in response to the first code, an amplifying means for providing the first comparison signal in response to the ADC input signal, for amplifying a signal difference between the ADC input signal and the reference signal selected by the multiplexer means, and providing the second comparison signal in response thereto, and a digital means for converting the first and second codes into the output code of the ADC.

In another embodiment the ADC comprises: a reference current source, a resistive means coupled to the reference current source and also coupled to receive a first and second reference signals for providing respectively a plurality of first and a plurality of second comparison signals in response thereto, comparator means for comparing the first and second comparison signals against ground, and producing respectively a first and second codes in response thereto, a multiplexer means for selecting one of the first comparison signals in response to the first code, an amplifying means for providing the first reference signal in response to the ADC input signal, for amplifying the first comparison signal selected by the multiplexer means, and providing the second reference signal in response thereto, and a digital means for converting the first and second codes into the output code of the ADC.

BRIEF DESCRIPTION OF THE DRAWINGS

The present invention will become more clear in conjunction with the accompanying figures of which.

Throughout the drawings, similar reference denote similar parts.

DETAILED DESCRIPTION OF THE INVENTION

Figure 1:
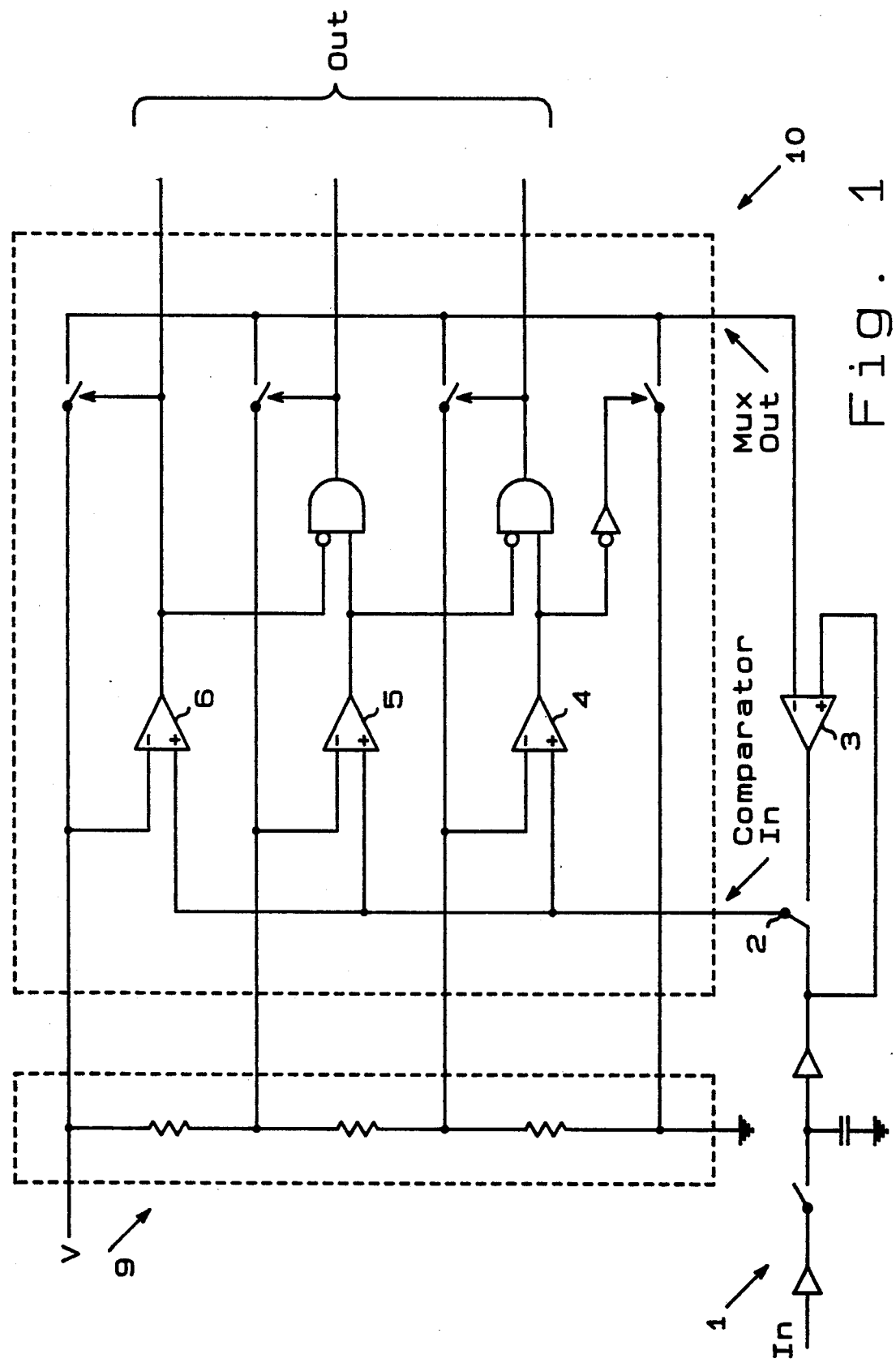
FIG. 1 is a schematic diagram of a 4-bit dual flash ADC of the present invention.

FIG. 1 is a schematic diagram of a 4-bit dual flash ADC of the present invention. The necessary storing of a momentary value of the ADC input signal can be accomplished by any THA coupled in series with the ADC input. The THA 1 consisting of a pair of voltage followers, switch and a capacitor connected to ground is shown as an example. By closing the switch the ADC input voltage is applied to the capacitor and stored therein when the switch opens. The output voltage of the THA 1 is applied to the comparator input of the comparator/multiplexer section 10 via the switch 2. This initiates the first conversion phase.

The resistor network 9 consists of resistors coupled in series between a pair of reference signal sources, one of which is ground. The network 9 divides down the voltage of the reference source V for providing a plurality of reference signals. The resistors are equally valued for obtaining all quantization levels. Also a current source can be used as the source V.

The comparator/multiplexer section 10 includes a plurality of comparators each having a noninverting input coupled to the comparator input of the section 10, and an inverting input receiving a specific reference voltage deriving from the resistor network 9. The THA output voltage, which is a first comparison signal, is applied to the comparator input of the section 10. By these means the THA output voltage is compared against the reference signals, whereby a first code is produced in response thereto. Similarly, the section 10 includes a plurality of switches for selecting one of the reference voltages in response to the first code. The switches constitute a multiplexer as each switch is coupled for applying a specific reference voltage deriving from the network 9 to the multiplexer output of the section 10.

Only one pair of adjacent comparators, i.e. having inputs coupled to the same resistor of the network 9, outputs "zero-one". All comparators receiving higher and lower reference voltages output "zero" and "one" respectively. The code produced by the comparators, referred to as the "thermometer" code, is converted in the first code. This code has only a single "one" indicating the "zero-one" break and is thus well suited for controlling the switches of the multiplexer.

For that purpose a plurality of AND gates is used, each having an inverting and noninverting inputs and coupled to the outputs of adjacent comparators which are 4, 5 and 5, 6. This also significantly simplifies the multiplexer structure as in place of its decoder the AND gates, each controlling a single switch, are used. Moreover, the output code of the section 10 is the first code deriving from the gates, as shown in FIG. 1. Generally, the "thermometer" code would result in a more complex structure of an encoder processing the code.

In the following the term 1LSB refers to the resolution of the section 10 and thus corresponds to a 2-bit resolution. The full scale range (FSR) of the ADC is equal to the voltage of the reference source V plus 1LSB, whereby the voltage drop across each resistor of the network 9 is 1LSB.

The multiplexer includes four switches. For instance, for the THA output voltage below 1LSB, the reference voltage at the multiplexer output is zero as the switch controlled by the comparator 4 is on. For the voltages equal or higher than 1LSB one of the remaining switches is on. For example, if the THA output voltage is equal or higher than FSR—1LSB, the switch controlled by the comparator 6 is on, thus applying the voltage of the reference source V to the multiplexer output. By these means the difference between the THA and multiplexer output voltage, i.e. a residue signal, is zero or positive and smaller than 1LSB. Abnormal operating conditions of the ADC can be detected by a pair of additional comparators sensing ADC input signals below zero and equal or higher than the FSR.

During the second conversion phase the residue signal is amplified in the differential amplifier 3. The amplified signal, which is a second comparison signal, is applied to the comparator input of the section 10 via the switch 2 for comparing against the reference signals and producing the second code. As mentioned, the residue signal is smaller than 1LSB. The on-resistance of the individual switches employed in the multiplexer is insignificant for a high inverting input impedance of the amplifier 3. The gain of the amplifier 3 is chosen in such a manner that for the residue signal equal 1LSB its output signal is equal to the FSR. In the present embodiment of the 4-bit ADC, the gain is equal 4. When the second code is received by the digital section, the switch 2 is switched to its initial position and the ADC is ready for a new conversion.

The THA 1, switch 2 and differential amplifier 3 are parts of an amplifying means operative to successively provide the first and second comparison signals to the comparator input of the section 10. During the first and second conversion phases the signals are equal to the output signals of the THA 1 and differential amplifier 3 respectively. The signals are successively applied via the switch 2 to the section 10. The operation of the ADC will become even more clear by further analyzing the above example of the 4-bit ADC by the end of the first conversion phase. For the voltage of the reference source V equal 3 V, 1LSB corresponds to 1 V and the FSR is 4 V.

| THA output voltage | Mux output voltage | Thermometer code | First code |
| --- | --- | --- | --- |
| 0 to 0.99 ... V | 0 V | 000 | 000 |
| 1 to 1.99 ... V | 1 V | 001 | 001 |
| 2 to 2.99 ... V | 2 V | 011 | 010 |
| 3 to 3.99 ... V | 3 V | 111 | 100 |

Figure 2:
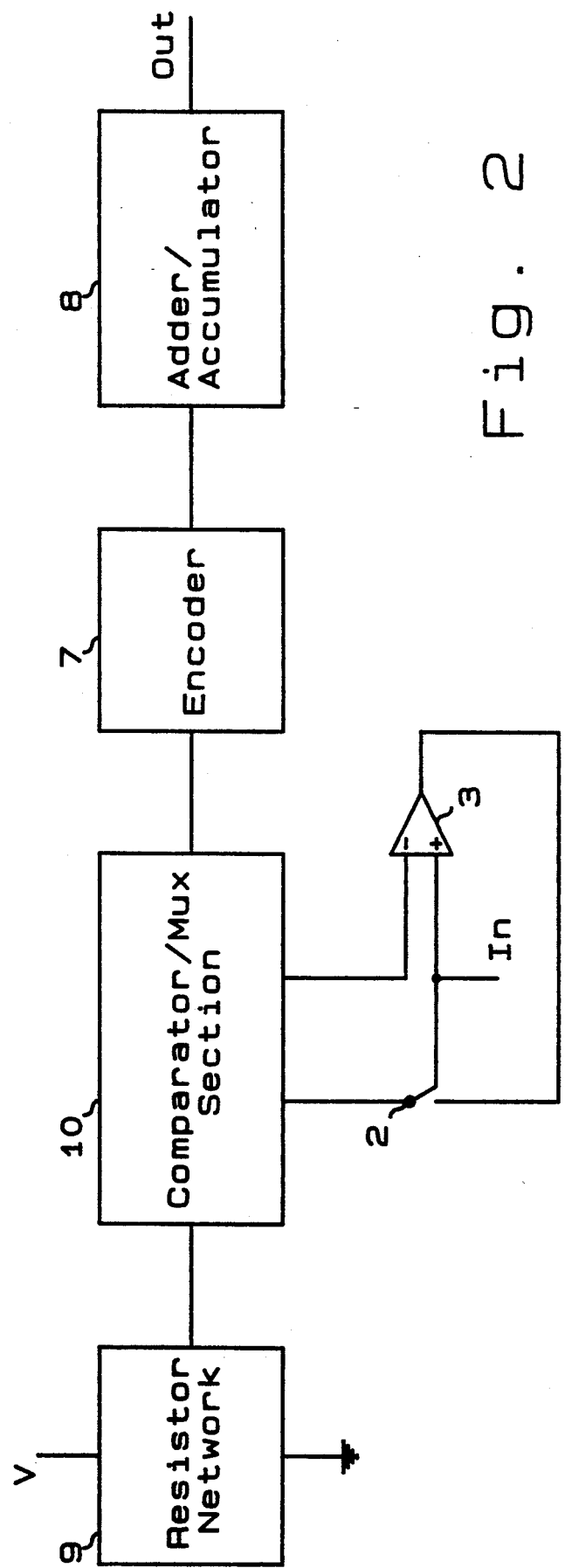
FIG. 2 is a block diagram of the FIG. 1 embodiment including a digital section.

FIG. 2 is a block diagram of the FIG. 1 embodiment including a digital section. A THA, not shown for simplicity, is coupled in series with the ADC input and provides an output signal to the comparator input of the comparator/multiplexer section 10. The section 10 also receives the reference voltages from the resistor network 9 which divides down the voltage of the reference source V. Furthermore, a selected reference voltage appears at the multiplexer output in response to the first code. On the beginning of the second conversion phase the switch 2 is switched so that the output signal of the differential amplifier 3 is applied to the comparator input for producing the second code. The amplifier 3 amplifies the difference between the THA and multiplexer output signals. When the second code is received by the digital section, the switch 2 is switched to its initial position and the ADC is ready for a new conversion.

The digital section is coupled to receive the first and second codes by the end of the first and second conversion phases respectively. It includes the encoder 7 for sampling the codes, correcting faulty code sequences and obtaining a respective first and second binary output codes. The binary codes are added/subtracted in the adder/accumulator 8 for providing the output code of the ADC. An encoder of an ordinary flash ADC can be employed. The encoder described in the patent application entitled "Encoder for Flash ADCs" having Ser. No. 946,598 and filed on 12/24/86 by the same inventor is recommended for a significantly higher performance.

The first and second binary codes represent the output signals of the THA and differential amplifier 3 respectively. Therefore, the first binary code has a higher weight proportional to the gain of the differential amplifier 3. The higher weight can be attained simply by applying the first binary code to input terminals of the adder/accumulator 8 having higher weight. Ideally, the first and second binary codes are respectively MSBs and LSBs of the ADC output code, whereby no adder is necessary.

Figure 3:
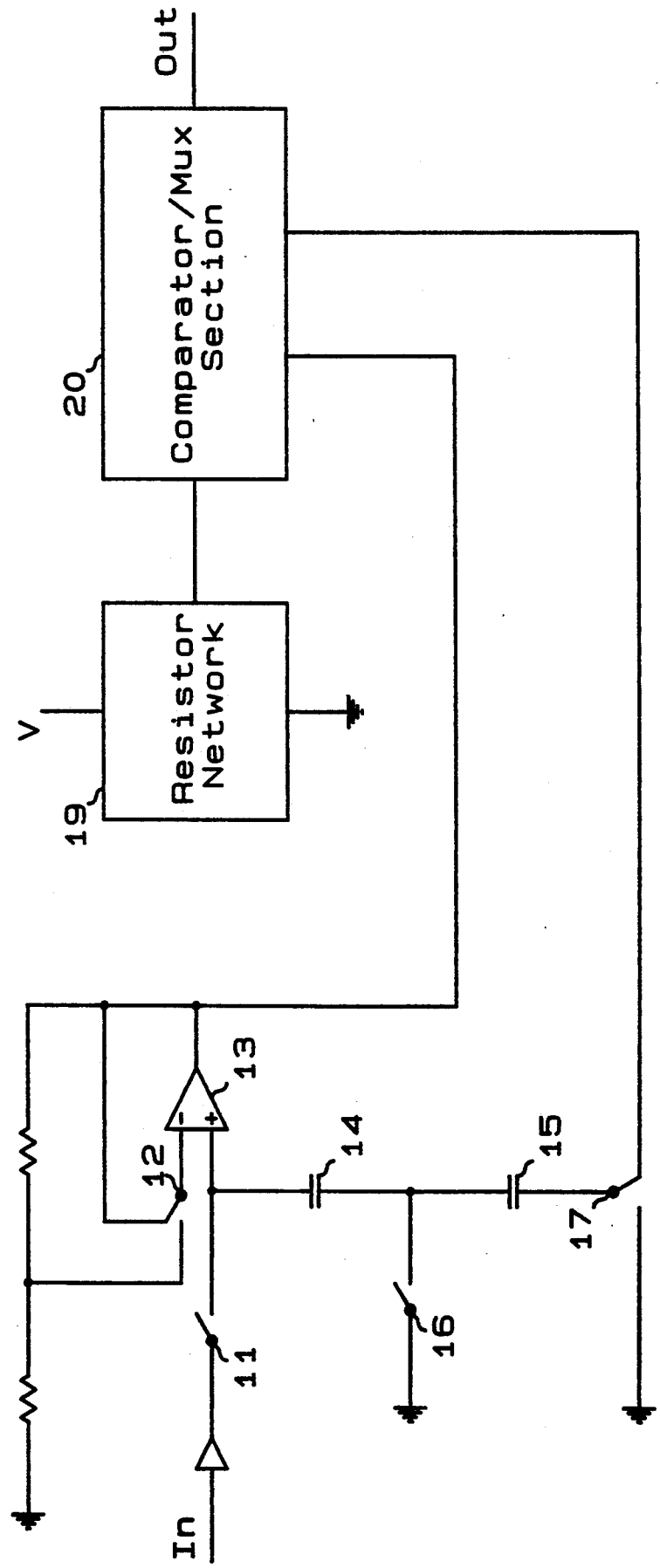
FIG. 3 is another embodiment with a capacitor pair providing a residue signal.

FIG. 3 is another embodiment with a capacitor pair providing a residue signal. The ADC input signal is applied to an amplifying means which includes a sampling means for sensing the ADC input signal and storing a momentary value thereof, and a means for storing a multiplexer output signal, serial coupling the capacitors and amplifying the residue signal appearing thereacross. The ADC also includes the reference voltage source V, resistor network 19 and comparator/multiplexer section 20, such as shown in FIG. 1. These components are coupled and operate as the respective components of FIGS. 1 and 2.

Specifically, the ADC input voltage is applied to the capacitor 14 via a voltage follower and the switch 11 coupled in series, whereby a momentary value of the voltage is stored in the capacitor 14 when the switch 11 opens. The multiplexer output signal is applied to and stored in the capacitor 15. The capacitor voltages are amplified in an amplifier having predetermined gains. For that purpose the operational amplifier (OA) 13, switch 12 and a resistor divider coupled for providing a portion of the OA 13 output voltage are employed. The switch 12 is coupled in series with the inverting input of the OA 13 for selecting a unity gain or a higher gain set by the resistor divider. Thus, an ordinary noninverting amplifier configuration is constituted.

During the first conversion phase the noninverting input of the OA 13 receives the first comparison voltage. This voltage is stored in the capacitor 14 which is coupled to ground via the closed switch 16. The first comparison voltage is also applied to the comparator input of the section 20 as the gain selected by the switch 12 is one. The section 20 provides a first code representing the voltage. In response to the first code a nearest reference voltage smaller or equal to the voltage across the capacitor 14 appears at the multiplexer output of the section 20.

On the beginning of the second conversion phase the switches 12, 16 and 17 are switched. Specifically, the multiplexer output voltage is applied via the switch 17 to the capacitor 15 and stored therein when the switch 17 is switched. The switch 16 opens simultaneously so that the capacitors 14 and 15 are coupled in series and also to ground via the switch 17. The ADC input sample and the multiplexer output voltage stored in the capacitors respectively 14 and 15 are subtracted, whereby the difference is the residue signal. The OA 13 amplifies the difference for providing the second comparison voltage to the section 20. As a result, the section 20 provides a second code representing the voltage. The gain selected by the switch 12 is such that for the difference equal 1LSB the voltage is equal to the FSR.

A digital section, e.g. as shown in FIG. 2 and described hereinabove, is coupled to receive the first and second codes by the end of the first and second conversion phases respectively, for obtaining the output code of the ADC. When the second code is received by the digital section, the switches 11, 12 and 16 are switched to their initial positions and the ADC is ready for a new conversion.

Figure 4:
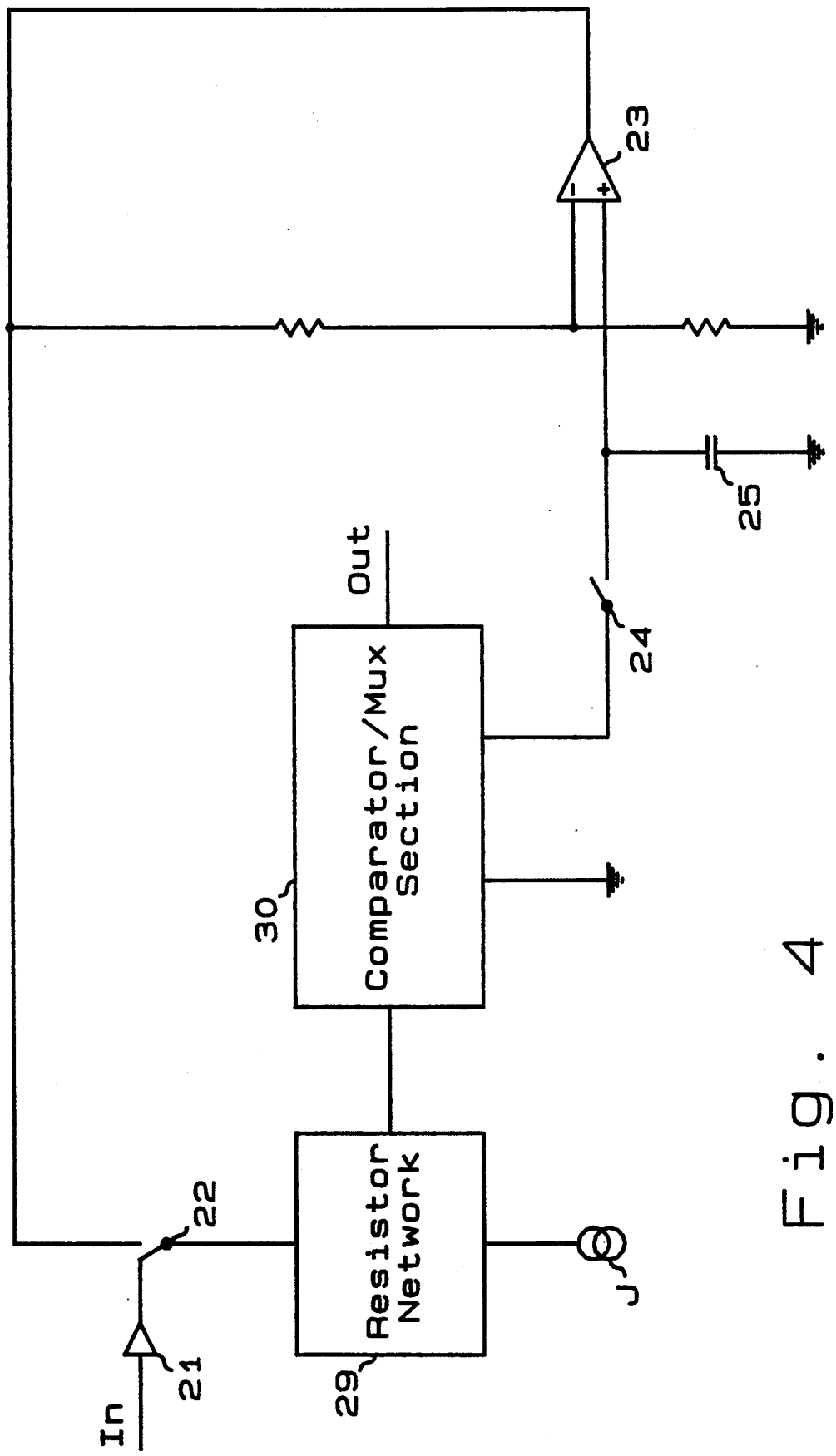
FIG. 4 is an embodiment for a very high speed.

FIG. 4 is an embodiment for a very high speed. The THA 21, e.g. as 1 shown in FIG. 1, is coupled in series with the ADC input. The ADC also includes the resistor network 29 and comparator/multiplexer section 30, such as shown in FIG. 1, which are coupled and operate as in the embodiments of FIGS. 1 thru 3. However, the reference voltage source V and ground connection are replaced by the reference current source J and switch 22 respectively. Furthermore, the input polarity of the comparators 4 thru 6 is reversed. The comparator input of the section 30 is coupled to ground.

Specifically, the output voltage of the THA 21 is applied via the switch 22 to one terminal of the network 29. The other terminal thereof is coupled to the reference current source J. Therefore, the voltage appearing between these terminals is divided for providing first comparison voltages to the section 30. However, these voltages are now referenced to the altering THA output voltages, rather than a fixed voltage, and thus vary in response thereto. The comparator input of the section 30 is coupled to ground. Therefore, the comparators of the section 30 are comparing the first comparison signals against ground for determining polarity thereof and producing the first code. Moreover, the comparison voltage selected in response thereto and appearing at the multiplexer output is below 1LSB with reference to ground and thus can be directly amplified by an ordinary amplifier.

On the beginning of the second conversion phase the switch 24 is switched. The conversion speed is significantly increased as the multiplexer output voltage is applied to and stored in the capacitor 25 when the switch 24 opens. The switch 22 is also switched. The capacitor voltage is amplified and then applied to the network 29 via the switch 22. The THA output voltage is no longer required and the THA 21 can be used for providing a new sample of the ADC input voltage. The conversion speed is thus influenced by the acquisition time of the THA 21 or the second phase conversion time, whichever is longer.

The components 21 thru 25 are parts of an amplifying means operative to provide a pair of reference signals to the network 29. During the first conversion phase, the ADC input signal sample stored in the THA 21 is provided as the first reference signal. During the second conversion phase, the amplified multiplexer signal is the second reference signal. The network 29 receives the first and second reference signal for providing respectively a plurality of first and a plurality of second comparison signals in response thereto. The comparators of the section 30 compare the first and second comparison signals against ground, wherein respectively the first and second codes are produced in response thereto.

The switch 22 is employed for successively applying the first and second reference signals to the resistor network 29, whereby its on-resistance is coupled in series therewith. However, the constant current of the reference current source flows thru the switch 22. For higher accuracy, the switch 22 can be replaced by two single switches, one included in a feedback of the THA 21 and the other in the feedback of the OA 23, therefore coupled in series with the respective outputs thereof.

The current of the reference current source J is chosen in such a manner that for the THA output signal equal to the FSR, the smallest comparison voltage is 1LSB. Similarly, the gain of the amplifier is chosen in such a manner that its output signal is equal to the FSR for the multiplexer output signal equal 1LSB. The voltage drop across each resistor of the network 29 is 1LSB for equally valued resistors coupled in series. The amplifier consists of the OA 23 having noninverting input coupled to the capacitor 25 for amplifying the voltage appearing thereacross, and inverting input receiving a portion of the OA 23 output signal from a resistor divider, which also determines the gain.

A digital section, e.g. as shown in FIG. 2 and described hereinabove, is coupled to receive the first and second codes by the end of the first and second conversion phases respectively, for obtaining the output code of the ADC. When the second code is received by the digital section, the switch 22 is switched to its initial position and the ADC is ready for a new conversion.

The operation of the ADC will become even more clear by further analyzing the above example of the 4-bit ADC by the end of the first conversion. For clarity and by way of example, three THA output voltages are specified. The order of the outputs of the section 30 can be reversed for obtaining ascent first codes. For the FSR equal 4 V, 1LSB corresponds to 1 V.

| THA output voltage | Mux output voltage | Thermometer code | First code |
|---|---|---|---|
| 1.89 V | 0.89 V | 100 | 100 |
| 2.00 V | 0.00 V | 110 | 010 |
| 2.34 V | 0.34 V | 110 | 010 |

Figure 5:
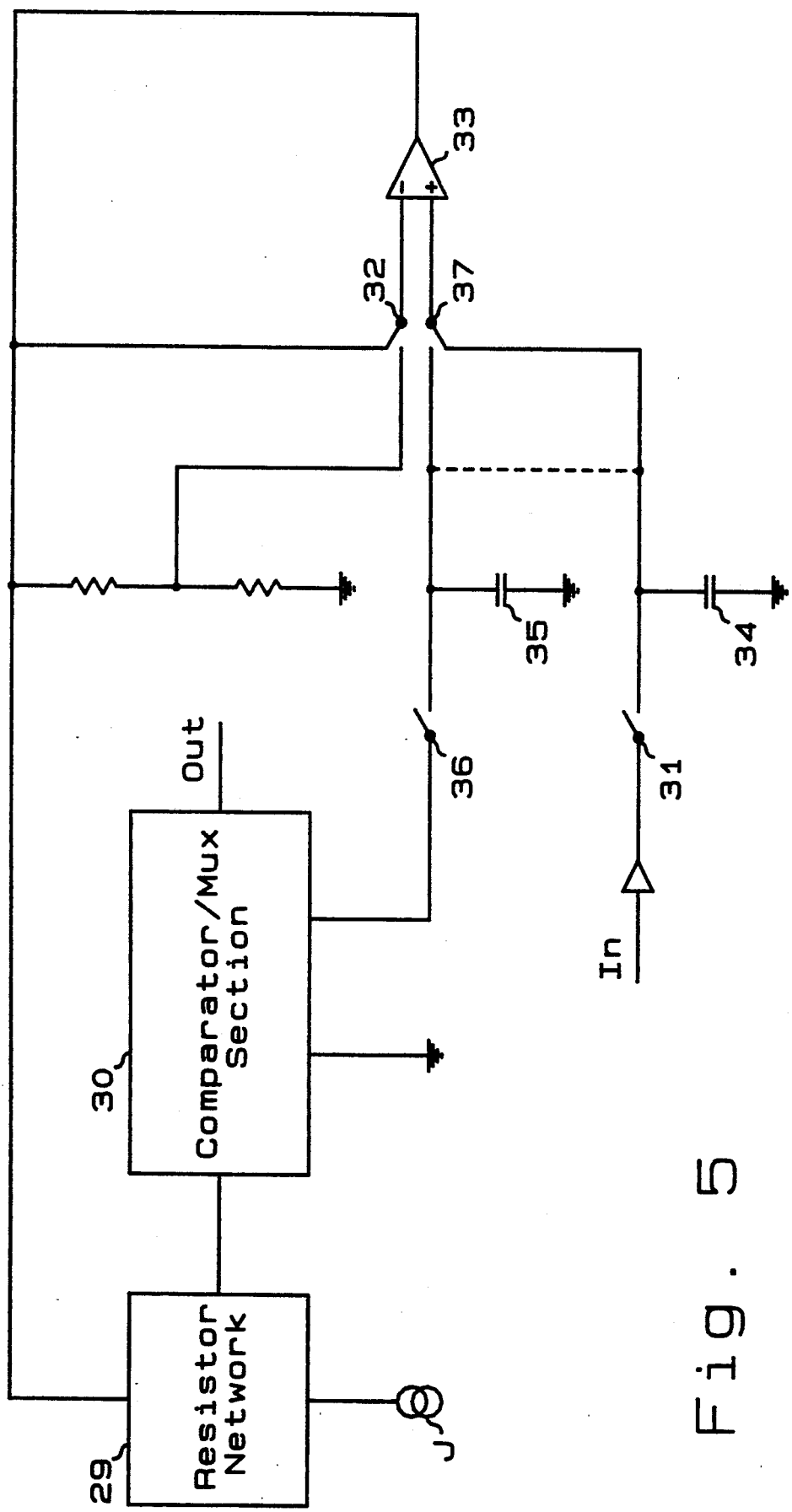
FIG. 5 is the preferred embodiment for a very high speed.

FIG. 5 is the preferred embodiment for a very high speed. The ADC input signal is applied to an amplifying means which includes a sampling means for sensing the ADC input signal and storing a momentary value thereof, and an amplifier means for storing and amplifying a multiplexer output signal. The ADC also includes the resistor network 29 and comparator/multiplexer section 30, such as shown in FIG. 1, and the reference current source J. These components are coupled and operate as in the FIG. 4 embodiment, whereas the network 29 is coupled directly to the OA 33.

Specifically, the ADC input voltage is applied to the capacitor 34 via a voltage follower and the switch 31 coupled in series, whereby a momentary value of the voltage is stored in the capacitor 34 when the switch 31 opens. The multiplexer output signal is applied to and stored in the capacitor 35. The capacitor voltage is amplified in an amplifier having a predetermined gain. For that purpose the OA 33, switch 32 and a resistor divider coupled for providing a portion of the OA 33 output voltage are employed. The switch 32 is coupled in series with the inverting input of the OA 33 for selecting a unity gain or a higher gain set by the resistor divider. Thus, an ordinary noninverting amplifier configuration is constituted.

During the first conversion phase the noninverting input of the OA 33 receives a first reference voltage. This voltage is stored in the capacitor 34 and is also applied to the network 29 as the gain selected by the switch 32 is one. The section 30 provides a first code representing the voltage. In response to the first code a comparison voltage below 1LSB, with reference to ground, appears at the multiplexer output of the section 30.

On the beginning of the second conversion phase the switch 36 is switched. Thereby, the multiplexer output voltage is applied to the capacitor 35 and stored therein when the switch 36 opens. The switches 32 and 37 are also switched so that the OA 33 amplifies the capacitor voltage for providing the second reference voltage to the network 29. As a result, the section 30 provides a second code representing the voltage. The gain selected by the switch 32 is such that for the capacitor voltage equal 1LSB the second reference voltage is equal to the FSR. Concurrently, a new sample of the ADC input voltage can be applied to and stored in the capacitor 34.

The embodiment of FIG. 5 can be further simplified by combining the capacitors 34 and 35 into one, as indicated by the dashed line, whereby the switch 37 is superfluous. However, the ADC conversion time will be increased as the ADC input sample and multiplexer output signal may be stored in the capacitor one at a time. The on-resistance of the switches 32, 36, 37 and also the individual switches employed in the multiplexer is insignificant as the capacitor 35 is charged from a low impedance voltage source and the input bias currents of the OA 33 are very small.

A digital section, e.g. as shown in FIG. 2 and described hereinabove, is coupled to receive the first and second codes by the end of the first and second conversion phases respectively, for obtaining the output code of the ADC. When the second code is received by the digital section, the switches 32 and 37 are switched to their initial positions and the ADC is ready for a new conversion.

In the above embodiments, the reference and comparison signals are used to perform functions indicated by the signal names. In the embodiments of FIGS. 1 thru 3, the resistor network provides a plurality of reference signals to the comparator/multiplexer section. The comparator input thereof successively receives the first and second comparison signals. In the embodiments of FIGS. 4 and 5, the first and second reference signals are successively applied to the resistor network 29 which, in response thereto, provides a plurality of first and a plurality of second comparison signals to the section 30. The comparator input thereof is coupled to ground.

A dual flash conversion of the ADC input signal into the output code has been described with reference to specific embodiments. A triple flash conversion will be apparent to those of ordinary skill in the art. Generally, the third conversion can be accomplished by amplifying and converting a signal difference between the amplifying means and multiplexer output signals after the first and second conversion phases respectively, for the embodiments of FIGS. 1 thru 3. It can be accomplished by amplifying and converting the multiplexer output signal after the second conversion phase, for the embodiments of FIGS. 4 and 5, whereby the amplification will be performed at yet a higher gain.

However, the dual flash conversion will be sufficient in most cases as the final resolution of the comparator/multiplexer section can be effectively doubled. For that purpose, a slightly higher number of resistors, comparators and switches, etc. can be used in order to cover the signal difference or multiplexer output signal, of the respective embodiments, which can be negative or exceed 1LSB. This is caused by inaccuracies of the resistor network, comparator offset voltages, nonlinearity of the amplifying means, etc. In the embodiments of FIGS. 1 thru 3, the resistor network can be coupled between two reference voltage sources of opposite polarities. In the embodiments of FIGS. 4 and 5, the THA can exibit an output offset voltage or the comparator input of the section 30 can be coupled to a fixed voltage source rather than ground. For instance, a 16-bit ADC can employ 300 rather than 255 comparators and a corresponding number of other necessary components.

The embodiments of the present invention described herein are intended to be taken in an illustrative and not a limiting sense. Various modifications and changes may be made to these embodiments by persons skilled in the art without departing from the scope of the present invention as defined in the appended claims.

I claim:

1. Analog-to-digital converter (ADC) for converting input signal into output code, comprising:
 a source means for providing a reference current;
 a resistive means coupled to the source means and to a reference signal for providing a plurality of comparison signals;
 a comparator/multiplexer means for comparing the comparison signals against ground, selecting one of the comparison signals and producing a code;
 a switch means for selecting the input signal and subsequently the comparison signal selected by the comparator/multiplexer means;
 an amplifying means for amplifying the signal selected by the switch means and providing the reference signal; and
 a digital means for converting a plurality of the codes produced by the comparator/multiplexer means into the output code.

2. ADC of claim 1, wherein the switch means includes a sampling means coupled in series with the input signal for sensing the input signal, and including a capacitor for storing a momentary value of the input signal.

3. ADC of claim 2, wherein the switch means includes a switch for applying the comparison signal selected by the comparator/multiplexer means to the capacitor.

4. ADC of claim 1, wherein the switch means includes a capacitor coupled for storing the comparison signal selected by the comparator/multiplexer means.

5. ADC of claim 1, wherein the amplifying means includes an operational amplifier having noninverting input, and
 further wherein the switch means includes a switch coupled to the noninverting input.

6. ADC of claim 1, wherein the amplifying means includes an amplifier having a gain for providing the reference signal, and a means for increasing the amplifier gain.

7. ADC of claim 6, wherein the amplifier includes an operational amplifier having an inverting input, and further wherein the means for increasing includes:
 a second switch means coupled to the inverting input for selecting the gain; and
 a second resistive means for applying the reference signal to the second switch means.

* * * * *